(12) United States Patent
Huang

(10) Patent No.: US 7,994,488 B2
(45) Date of Patent: Aug. 9, 2011

(54) LOW CONTAMINATION, LOW ENERGY BEAMLINE ARCHITECTURE FOR HIGH CURRENT ION IMPLANTATION

(75) Inventor: Yongzhang Huang, Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 676 days.

(21) Appl. No.: 12/108,890

(22) Filed: Apr. 24, 2008

(65) Prior Publication Data
US 2009/0267001 A1 Oct. 29, 2009

(51) Int. Cl.
*G21K 1/00* (2006.01)
(52) U.S. Cl. ............ 250/492.21; 250/396 R; 250/397; 250/398; 250/492.2; 250/492.3
(58) Field of Classification Search .......... 250/396 R, 250/397, 398, 492.1, 492.2, 492.21, 492.3
See application file for complete search history.

(56) References Cited

U.S. PATENT DOCUMENTS

| | | | |
|---|---|---|---|
| 5,091,645 A * | 2/1992 | Elliott | 250/305 |
| 5,481,116 A * | 1/1996 | Glavish et al. | 250/396 ML |
| 5,780,863 A * | 7/1998 | Benveniste et al. | 250/492.21 |
| 6,111,260 A * | 8/2000 | Dawson et al. | 250/492.21 |
| 6,231,054 B1 * | 5/2001 | Allen, Jr. et al. | 277/634 |
| 6,437,350 B1 * | 8/2002 | Olson et al. | 250/492.21 |
| 6,441,382 B1 * | 8/2002 | Huang | 250/492.21 |
| 6,635,880 B1 * | 10/2003 | Renau | 250/396 ML |
| 6,710,358 B1 * | 3/2004 | Chen et al. | 250/492.21 |
| 6,777,695 B2 * | 8/2004 | Viviani | 250/492.21 |
| 6,777,696 B1 * | 8/2004 | Rathmell et al. | 250/492.21 |
| 6,946,667 B2 * | 9/2005 | Chen et al. | 250/492.21 |
| 6,998,625 B1 * | 2/2006 | McKenna et al. | 250/492.21 |
| 7,135,691 B2 | 11/2006 | Vanderpot et al. | |
| 7,351,987 B2 * | 4/2008 | Kabasawa et al. | 250/492.21 |
| 2002/0066872 A1 * | 6/2002 | Nishihashi et al. | 250/492.21 |
| 2003/0066976 A1 * | 4/2003 | Chen et al. | 250/492.21 |
| 2004/0227074 A1 * | 11/2004 | Benveniste et al. | 250/298 |
| 2005/0230643 A1 * | 10/2005 | Vanderpot et al. | 250/492.21 |
| 2006/0097193 A1 * | 5/2006 | Horsky et al. | 250/492.21 |
| 2006/0145095 A1 * | 7/2006 | Olson et al. | 250/492.21 |
| 2006/0219955 A1 * | 10/2006 | Ray | 250/492.21 |
| 2006/0284117 A1 * | 12/2006 | Vanderpot et al. | 250/492.21 |
| 2007/0114455 A1 * | 5/2007 | Naito et al. | 250/492.21 |
| 2008/0258074 A1 * | 10/2008 | Tsukihara et al. | 250/396 R |
| 2009/0261248 A1 * | 10/2009 | Glavish et al. | 250/298 |

* cited by examiner

*Primary Examiner* — Phillip A Johnston
*Assistant Examiner* — Michael J Logie
(74) *Attorney, Agent, or Firm* — Eschweiler & Associates, LLC

(57) ABSTRACT

An ion implantation system comprising an ion source that generates an ion beam along a beam path, a mass analyzer component downstream of the ion source that performs mass analysis and angle correction on the ion beam, a resolving aperture electrode comprising at least one electrode downstream of the mass analyzer component and along the beam path having a size and shape according to a selected mass resolution and a beam envelope, a deflection element downstream of the resolving aperture electrode that changes the path of the ion beam exiting the deflection element, a deceleration electrode downstream of the deflection element that decelerates the ion beam, a support platform within an end station for retaining and positioning a workpiece which is implanted with charged ions, and wherein the end station is mounted approximately eight degrees counterclockwise so that the deflected ion beam is perpendicular to the workpiece.

5 Claims, 6 Drawing Sheets

LOW CONTAMINATION, LOW ENERGY BEAMLINE ARCHITECTURE FOR HIGH CURRENT ION IMPLANTATION

FIELD OF THE INVENTION

The present invention relates generally to ion implantation systems, and more specifically to systems and methods for low contamination, low energy beamline architecture for high current ion implanters.

BACKGROUND OF THE INVENTION

In the manufacture of semiconductor devices, ion implantation is used to dope semiconductors with impurities or dopants. Ion beam implanters are used to impact silicon wafers with an ion beam, in order to produce n or p type extrinsic material doping or to form passivation layers during fabrication of an integrated circuit. When used for doping semiconductors, the ion beam implanter injects a selected extrinsic ion species to produce the desired semiconducting material. Referring initially to prior art FIG. 1 is a conventional ion implantation system 100. Implanting ions generated from source materials such as antimony, arsenic or phosphorus results in "n type" extrinsic material wafers, whereas if "p type" extrinsic material wafers are desired, ions generated with source materials such as boron, or indium may be implanted.

An ion source 102 for producing an (e.g., a pencil ion beam, a ribbon-shaped, etc.) ion beam 104 along a longitudinal beam path 106. The ion beam source 102 includes a plasma source with an associated power source and an extraction apparatus 110, which may be of any design by which the ion beam 104 is extracted, for example. The following examples are provided to more fully illustrate the invention, but are not to be construed as limiting the scope thereof. For instance, the plasma source may comprise a relatively long plasma confinement chamber from which the ion beam 104 can be extracted using an extraction opening in the extraction apparatus 110. The formation of pencil, ribbon and other type ion beams is well known by those of skill in the art.

To produce the ions, a gas of a dopant material (not shown) to be ionized is located within a plasma chamber of the ion beam source 102. The dopant gas can, for example, be fed into the plasma chamber from a gas source (not shown). In addition to a power supply, it will be appreciated that any number of suitable mechanisms (none of which are shown) can be used to excite free electrons within an ion generation chamber, such as RF or microwave excitation sources, electron beam injection sources, electromagnetic sources and/or a cathode which creates an arc discharge within the chamber, for example. The excited electrons collide with the dopant gas molecules and ions are generated therein. Typically, positive ions are generated although the disclosure herein is applicable to systems wherein negative ions are generated as well.

The ions are controllably extracted through the extraction apparatus 110 in the ion beam source 102 by an ion extraction assembly (not shown), in this example. The ion extraction assembly can comprise a plurality of extraction, ground and suppression electrodes. The extraction assembly can include, for example, a separate extraction power supply (not shown) to bias the extraction and/or suppression electrodes to accelerate the ions from the ion source 102. It can be appreciated that since the ion beam 104 comprises like charged particles, the beam 104 may have a tendency to blow up or expand radially outwardly as the like charged particles repel one another. It can also be appreciated that beam blow up can be exacerbated in low energy, high current beams where many like charged particles (e.g., high current) are moving in the same direction relatively slowly (e.g., low energy) such that there is an abundance of repulsive forces among the particles, but little particle momentum to keep the particles moving in the direction of the beam path 106. Accordingly, the extraction assembly 110 is generally configured so that the beam 104 is extracted at a high energy so that the beam 104 does not blow up (e.g., so that the particles have sufficient momentum to overcome repulsive forces that can lead to beam blow up). Moreover, the beam 104, in this example, is generally transferred at a relatively high energy throughout the system and is reduced just before impacting with the workpiece 116 to promote beam containment.

A beamline system 112 is provided downstream of the ion source 102 to receive the beam 104 therefrom, comprising a mass analyzer 114 positioned along the path to receive the beam 104. The mass analyzer 108 operates to provide a magnetic field across the path so as to deflect ions from the ion beam 104 at varying trajectories according to mass (e.g., charge to mass ratio) in order to provide a mass analyzed ion beam 104 as illustrated in FIG. 1. The mass analyzer 114 therefore performs mass analysis and angle correction/adjustment on the ion beam 104. The mass analyzer 114, in this example, is formed at about a ninety degree angle and comprises one or more magnets (not shown) that serve to establish a (dipole) magnetic field therein. As the beam 104 enters the mass analyzer 114, it is correspondingly bent by the magnetic field such that ions of an inappropriate charge-to-mass ratio are rejected. More particularly, ions having too great or too small a charge-to-mass ratio are deflected into side walls of the mass analyzer 114. In this manner, the mass analyzer 114 merely allows those ions in the beam 104 which have the desired charge-to-mass ratio to pass therethrough and exit through a resolving aperture 116 of the resolving aperture electrode assembly 120.

The mass analyzer 114 can perform angle corrections on the ion beam 104 by controlling or adjusting the amplitude of the magnetic dipole field. This adjustment of the magnetic field causes selected ions having the desired/selected charge-to-mass ratio to travel along a different or altered path. The resolving aperture electrode assembly 110 is located downstream of the mass analyzer component 114 and along the beam path. A resolving aperture electrode assembly 116 has a size and shape according to a selected mass resolution and a beam envelope of the ion beam 104.

One or more deceleration electrodes 118 can located downstream of the ion beam deflecting component. The deceleration electrodes can be directly utilized for a high-current, ultra-low energy ion implanter to enable a high-current ion beam to be generated with ultra-low energy and with reduced energy contamination. Up to this point in the system 100, the beam 104 is generally transported at a relatively high energy level to mitigate the propensity for beam blow up, which is well known in the art, which can be particularly high where beam density is elevated such as at a scan vertex, for example. The deceleration electrodes comprise one or more electrodes operable to decelerate the beam 104. The electrodes typically contain apertures thru which the beam 104 travels.

Nevertheless, it will be appreciated that while deceleration electrodes 118 are respectively illustrated in the exemplary system 100, as parallel and with the apertures in the same plane, that these electrodes may comprise any suitable number of electrodes arranged and biased to accelerate and/or decelerate ions, as well as to focus, bend, deflect, converge, diverge, scan, parallelize and/or decontaminate the ion beam 104 such as provided in U.S. Pat. No. 6,441,382 to Huang et al., the entirety of which is hereby incorporated by reference.

An end station 108 is provided in the system 100, which receives the mass analyzed ion beam 104 from the beamline system 112 and supports one or more workpieces 110 such as semiconductor wafers along the path for implantation using the final mass analyzed ion beam 122. The end station 108 includes a target scanning system 126 for translating or scanning one or more target workpieces 110 and the ion beam 104 relative to one another. The target scanning system 126 may provide for batch or serial implantation.

It will be appreciated that ion beam collisions with other particles in the system 100 can degrade beam integrity. Accordingly, one or more pumps (not shown) may be included to evacuate, at least, the beamguide and the mass analyzer 114.

Typical ion implantation systems include an ion source 102 for generating positively charged ions from ionizable source materials. The generated ions are formed into an ion beam 104 and are directed along a predetermined beam path 106 to an implantation end station 108. The ion implantation system 100 may include beam forming and shaping structures extending between the ion source 102 and the implantation end station 108. The beam forming and shaping structures maintain the ion beam 104 and bound an elongated interior cavity or passageway through which the beam passes en route to the implantation end station 108. When operating an implanter, this passageway is evacuated to reduce the probability of ions being deflected from the predetermined beam path 106 as a result of collisions with gas molecules.

Trajectories of charged particles of given kinetic energy in a magnetic field will differ for different masses (or charge-to-mass ratios) of these particles. Therefore, the part of an extracted ion beam 104 which reaches a desired area of a semiconductor workpiece 110 or other target after passing through a constant magnetic field can be made relatively pure since ions of undesirable molecular weight will be deflected to positions away from the beam 104 and implantation of other than desired materials can be avoided. The process of selectively separating ions of desired and undesired charge-to-mass ratios is known as mass analysis. The mass analyzer 114 typically employs a mass analysis magnet creating a dipole magnetic field to deflect various ions in the ion beam 104 via magnetic deflection in an arcuate passageway which will effectively separate ions of different charge-to-mass ratios.

For some ion implantation systems, the physical size of the beam 104 is smaller than a target workpiece 116, so the beam is scanned in one or more directions in order to adequately cover a surface of the target workpiece 116. Generally, an electrostatic or magnetic based scanner scans the ion beam 104 in a fast direction and a mechanical device moves the target workpiece 116 in a slow scan direction in order to provide sufficient cover. The system can include a current density sensor, such as a Faraday cup 124, for example, that measures the current density of the scanned beam, where current density is a function of the angle of implantation (e.g., the relative orientation between the beam and the mechanical surface of the workpiece and/or the relative orientation between the beam and the crystalline lattice structure of the workpiece 116). The current density sensor moves in a generally orthogonal fashion relative to the scanned beam 104 and thus typically traverses the width of the beam 104. The dosimetry system, in one example, measures both beam density distribution and angular distribution.

For typical high current ion implantation systems various deceleration elements can reduce the energy contamination and increase the low energy beam current. (See e.g., U.S. Pat. No. 6,441,382 to Huang, the entirety of which is hereby incorporated by reference).

However, the implementation of deceleration elements into an ion implanter is strongly influenced by the architecture of that specific ion implanter. Therefore a system is needed that can achieve low particle contamination levels at low energies and can maintain the other performance requirement of the ion implanter.

SUMMARY OF THE INVENTION

The following presents a simplified summary of the invention in order to provide a basic understanding of some aspects of the invention. This summary is not an extensive overview of the invention, and is neither intended to identify key nor critical elements of the invention nor to delineate the scope of the invention. Rather, the purpose of the summary is to present some concepts of the invention in a simplified form as a prelude to the more detailed description that is presented later.

Aspects of the present invention involve an ion implantation system comprising an ion source that generates an ion beam along a beam path, a mass analyzer component downstream of the ion source that performs mass analysis and angle correction on the ion beam, a resolving aperture electrode comprising at least one electrode downstream of the mass analyzer component and along the beam path having a size and shape according to a selected mass resolution and a beam envelope, a deflection element downstream of the resolving aperture electrode that changes an angle of the ion beam exiting the deflection element, a deceleration electrode downstream of the deflection element that performs charge neutralization and decelerates the ion beam, a support platform within an end station for retaining and positioning a workpiece which is implanted with charged ions, and wherein the end station is mounted approximately eight degrees counterclockwise so that the deflected ion beam is perpendicular to the workpiece.

In accordance with another aspect of the invention, an ion implantation system employs an ion implantation system comprising an ion source that generates an ion beam having a selected species, a mass analyzer positioned downstream of the ion source that generates a magnetic field according to a selected charge-to-mass ratio and an angle adjustment, a resolving aperture downstream of the mass analyzer, wherein the resolving aperture selects an ion species from a separated ion beam, a deflection element configured to deflect the ion beam counterclockwise approximately eight degrees along a modified ion beam path and a deceleration element downstream of the resolving aperture.

In accordance with yet another aspect of the present invention involves a method of performing ion implantation comprising selecting ion source parameters for an ion source, selecting an initial magnetic field strength for a mass analyzer according to a charge-to-mass ratio, generating an ion beam according to the selected ion source parameters, performing mass analysis on the ion beam by the mass analyzer, resolving the ion beam utilizing a resolving aperture, deflecting the ion beam using a deflection element and decelerating the ion beam utilizing a deceleration element.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
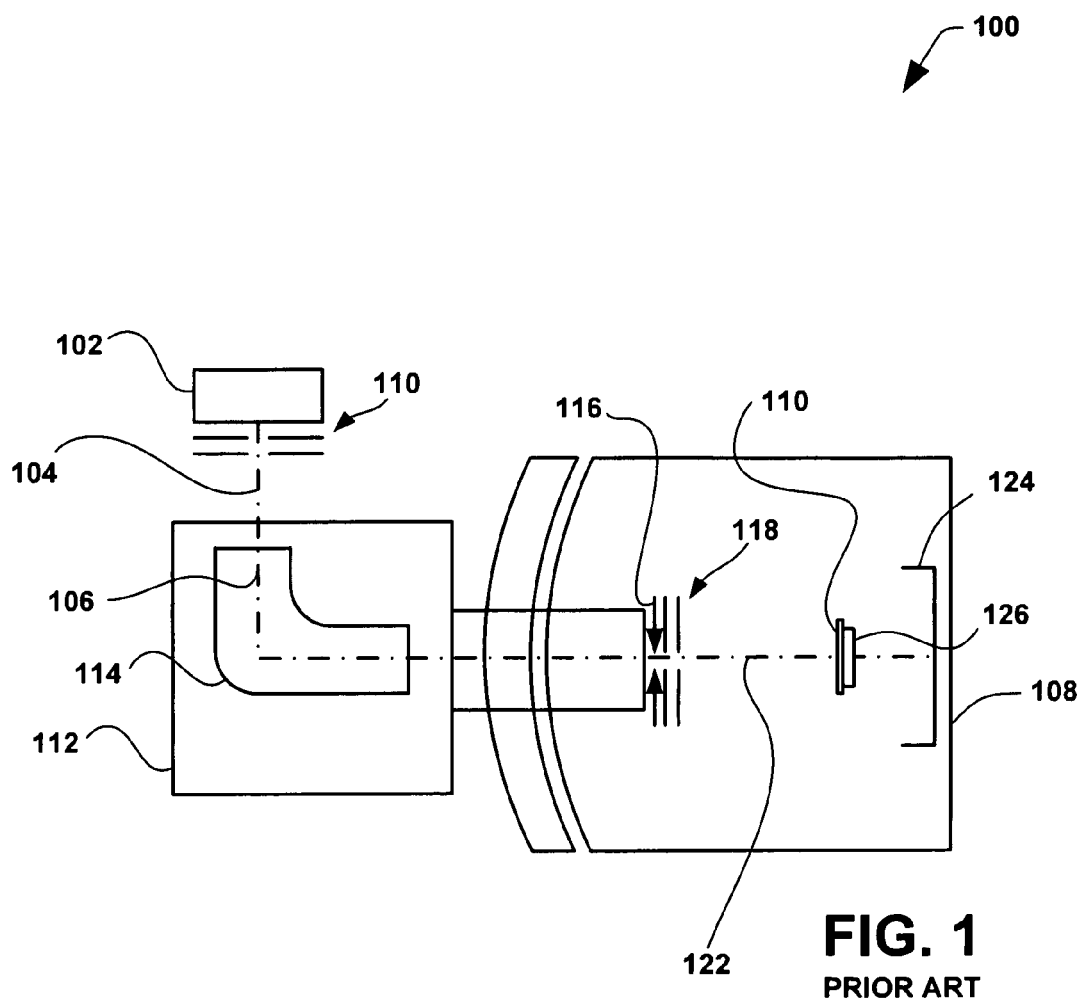
FIG. 1 illustrates a prior art ion implantation system.

The present invention will now be described with reference to the drawings wherein like reference numerals are used to refer to like elements throughout, and wherein the illustrated structures are not necessarily drawn to scale.

Aspects of the present invention facilitate low contamination, low energy beamline architecture for high current implantation.

Figure 2:
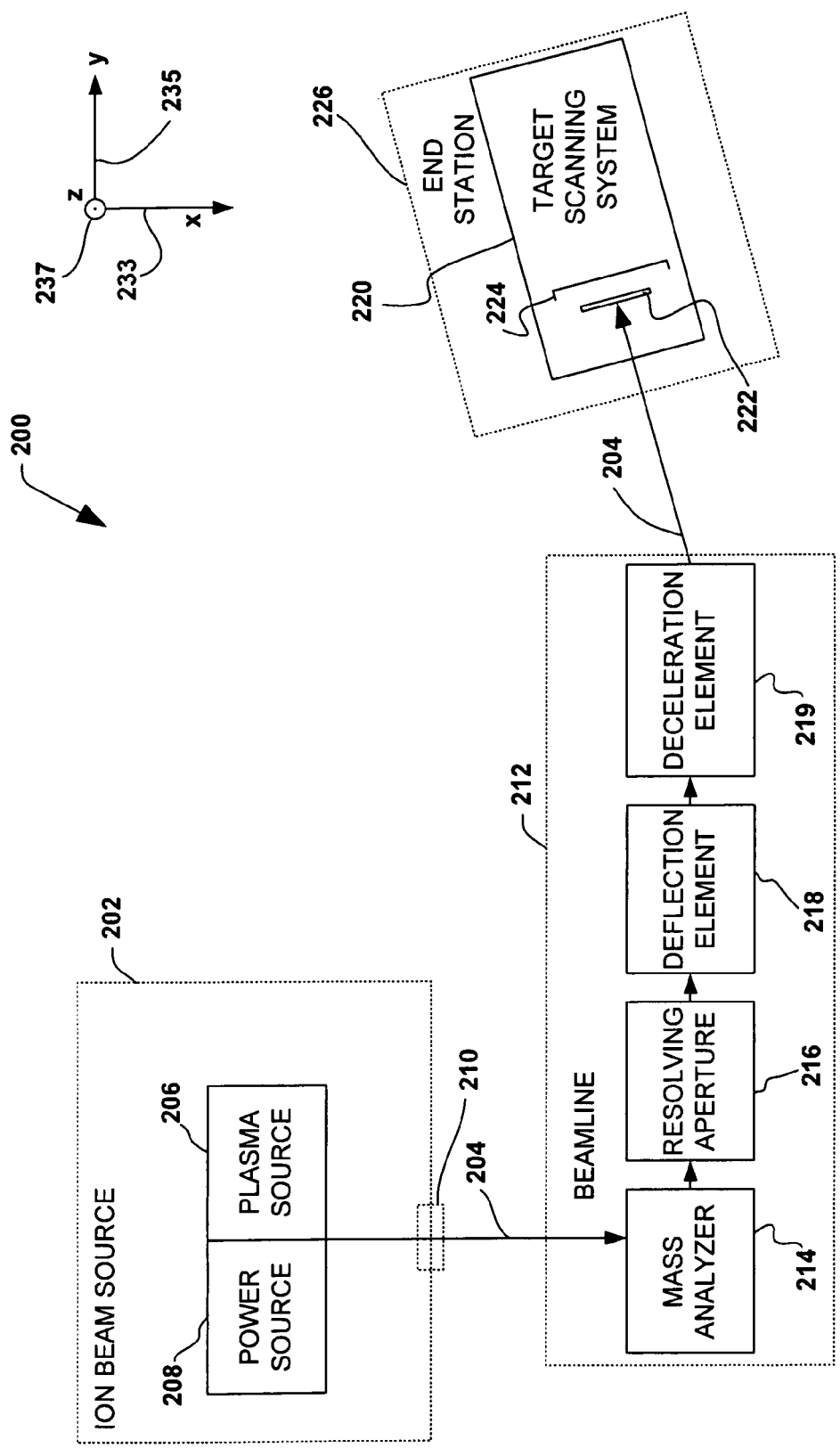
FIG. 2 illustrates an ion implantation system according to a present aspect of the present invention.

Referring initially to FIG. 2, disclosed is a first embodiment of the invention that provides an ion implantation system 200 comprising an ion source 202 for producing an (e.g., a pencil ion beam, a ribbon-shaped, etc.) ion beam 204 along a longitudinal beam path. The ion beam source 202 includes a plasma source 206 with an associated power source 208 and an extraction apparatus 210, which may be of any design by which the elongated ribbon ion beam 204 of large aspect ratio is extracted, for example. The following examples are provided to more fully illustrate the invention, but are not to be construed as limiting the scope thereof. For instance, the plasma source 206 may comprise a relatively long plasma confinement chamber from which the ribbon ion beam 204 can be extracted using a high aspect ratio extraction slit in the extraction apparatus 210. The ion beam 204 comprises a transverse width and a transverse height defining a first aspect ratio, wherein the transverse width is much larger than the transverse height. For example, the width of the elongated ion beam 204 extracted from the plasma source 206 can be approximately 100 mm, for example and the height can be 10 mm, for example. The formation of ribbon ion beams and other type ion beams is well known by those of skill in the art.

A beamline system 212 is provided downstream of the ion source 202 to receive the beam 204 therefrom, comprising a mass analyzer 214 positioned along the path to receive the beam 204, a resolving aperture 216 downstream of the mass analyzer 214, a deflection element 218 and an acceleration and/or deceleration component 219. The mass analyzer 214 operates to provide a magnetic field across the path so as to deflect ions from the ion beam 204 at varying trajectories according to mass (e.g., charge to mass ratio) in order to provide an elongated mass analyzed ion beam 204 having a second aspect ratio and profile substantially similar to the first aspect ratio. In this embodiment the ion beam 204 can be bent approximately 90 degrees by the magnetic fields within the mass analyzer 214. The mass separation resolving aperture 216 can be disposed in the path downstream of the mass analyzer 214 for permitting ions of a preselected chemical species to pass through the resolving aperture 216. Undesired ions are separated out by failing to pass through the resolving aperture opening. The focused ribbon ion beam 204 can then encounter the deflection element 218 wherein the beam 204 can be deflected, as illustrated, in the counter clockwise direction. The beam 204 can then enter a deceleration element 219 that can decelerate the ion beam 204 when the ion beam 204 passes through the deceleration electrodes of the deceleration element 219.

An end station 226 is provided in the system 200 that can be set at a constant angle of approximately eight degrees. However, it should be noted that the end station 226 can be set at any angle of from 0 to 90 degrees. The end station 226 receives the mass analyzed ion beam 204 from the beamline system 212 and supports one or more workpieces 222 such as semiconductor workpieces along the path for implantation using the mass analyzed and deflected ion beam 204. The end station 226 includes a target scanning system 220 for translating or scanning one or more target workpieces 222 and the elongated ion beam 204 relative to one another. The target scanning system 220 may provide for batch or serial implantation. It is to be appreciated that target scanning systems are well known by those of skill in the art.

The inventor recognized that the beamline 212 in the present invention realized at least two distinct advantages over convention beamline systems. First, the new beamline 212 includes the electrical bend or deflection element 218 and the deceleration element 219 that can act as a block that will block undesired particles coming from upstream of the deflection element 218. Those particles are usually pushed down stream by the momentum of the ion beam 204, the majority of the particles will move straight forward. Therefore, the deflection of beamline will reduce the number of particles which can arrive at the down stream workpiece 222. In addition, the deflection element 218 can act as a neutral particle separator which separates the upstream neutral particles from continuing in the downstream path. Second, the beamline 212 of the invention also includes the deceleration element 219 which can greatly increase the low beam energy current. The resultant system 200 leads to reduced energy contamination than the typical contamination found in conventional ion implantation systems.

Figure 3:
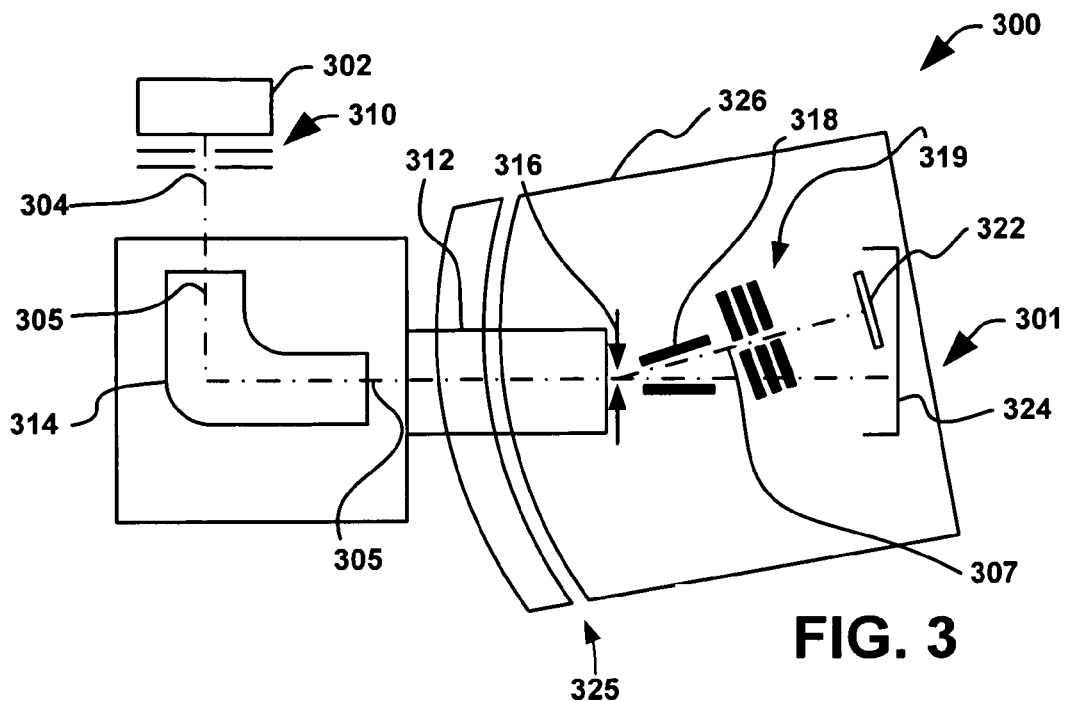
FIG. 3 illustrates an ion implantation system including a deflection element and a deceleration element in accordance with an aspect of the present invention, wherein the ions implant the workpiece with a zero degree angle.
Figure 4:
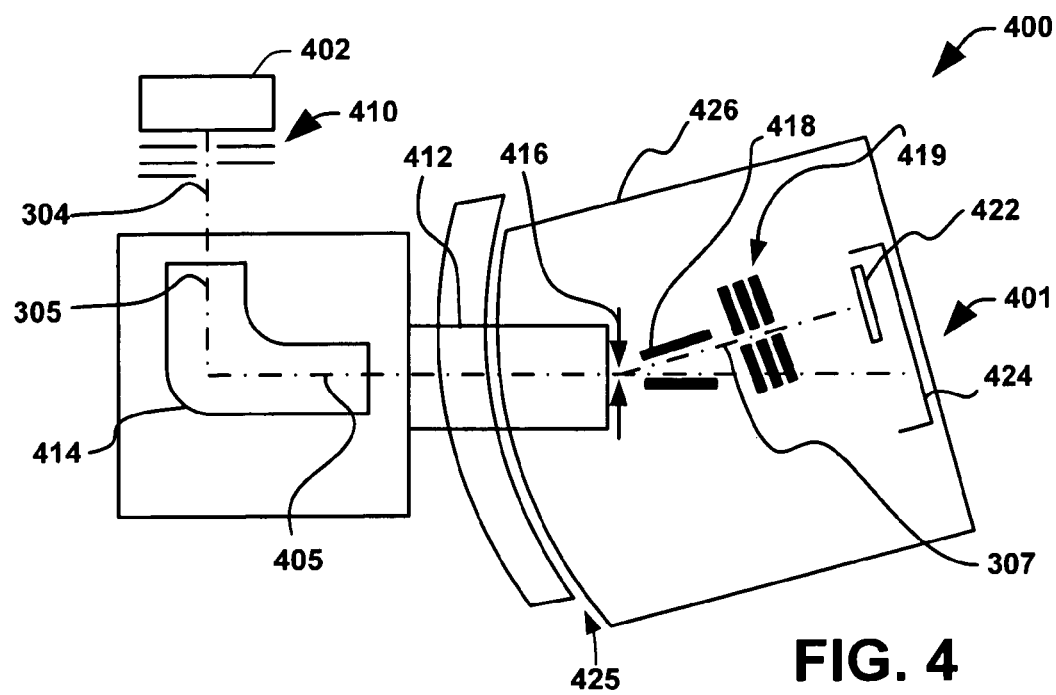
FIG. 4 is a view of an ion implantation system in accordance with an aspect of the present invention wherein an ion beam implants the workpiece with an angle of other than zero degrees.

Now referring to FIGS. 3 and 4, illustrated are two operating or working modes as additional embodiments to the present invention. In both ion implantation systems 300 and 400, an ion beam 304 travels along a first ion beam path 305 or a second ion beam path 307 in either a first mode 301, as shown in FIG. 3 or a second mode 401, as illustrated in FIG. 4.

In the first mode 301 illustrated in FIG. 3, the end station 326 is positioned or set so that the ion beam 304 hits the workpiece 322 with an approximate angle of zero degrees, in other words perpendicular to the workpiece 322.

In the second mode 401 of FIG. 4, the end station 426 is positioned or set to let the ion beam 304 hit the workpiece 422 with average angle greater than zero degrees. In order to accomplish this, the end station 426 can rotate along the orbit defined by the curved gap of 325 (FIG. 3) or 425 (FIG. 4). Such an end station is provided in U.S. Pat. No. 6,231,054 to Allen et al., the entirety of which is hereby incorporated herein by reference. In the first mode 301, the system works for both two working modes: drift beam mode and decel beam mode. in drift mode, the beam energy is greater than 10 KeV, wherein in decel mode the beam energy is 10 KeV or less. With regard to process control, the beamline 312 shown in FIG. 3 has a number of advantages over conventional beamlines. The beamline 312 allows faster beam tuning in the drift mode wherein the beam 304 can be extracted at energies greater than 10 KeV and the deceleration element 319 can be tuned to ground voltage. For the decel mode, the deceleration element 319 can be easily tuned to increase the beam current at low energies. In addition, the energy contamination will be reduced because of the upstream electrical bend. The beamline 312 allows precise dose control for the workpiece 322, wherein most of the neutral particles are separated from the ion beam 304 downstream of the deflection element 318. The bend in the ion beam 304, as illustrated with a second ion beam path 307 provides an angle control, as shown.

Now referring to FIG. 4, the ion implantation system 400 can function in very similar way to the system 300 in FIG. 3. The only difference is that the end station 426 is rotated to have the workpiece 422 face the ion beam 307 with a angle greater than zero degrees. In the ion implantation system 400, the ion beam 304 travels along the same first ion beam path 305 or the second ion path 307 in either a first mode 301 or a second mode 401, as illustrated in FIG. 4. In drift mode the ion beam energy is greater than 10 KeV, wherein in the decel mode the beam energy is 10 KeV or less. With regard to process control, the beamline 412 has a number of advantages over a conventional beamline. The beamline 412 allows faster beam tuning in the drift mode wherein the beam 404 can be extracted at energies greater than 10 KeV. The beamline 412 allows precise dose control for the workpiece 422, wherein most of the neutral particles are separated from the ion beam 404 downstream of the deflection element 418. The deceleration element 419 can be easily tuned to increase the beam current at low energies and to reduce energy contamination. The bend in the ion beam 404, as illustrated with a second ion beam path 307 provides an angle control, as shown. The end station 426 in FIG. 4 can rotate, as shown, so that the ion beam 404 can strike the workpiece 422 at an angle other than perpendicular to the second ion beam path 307.

Figure 5:
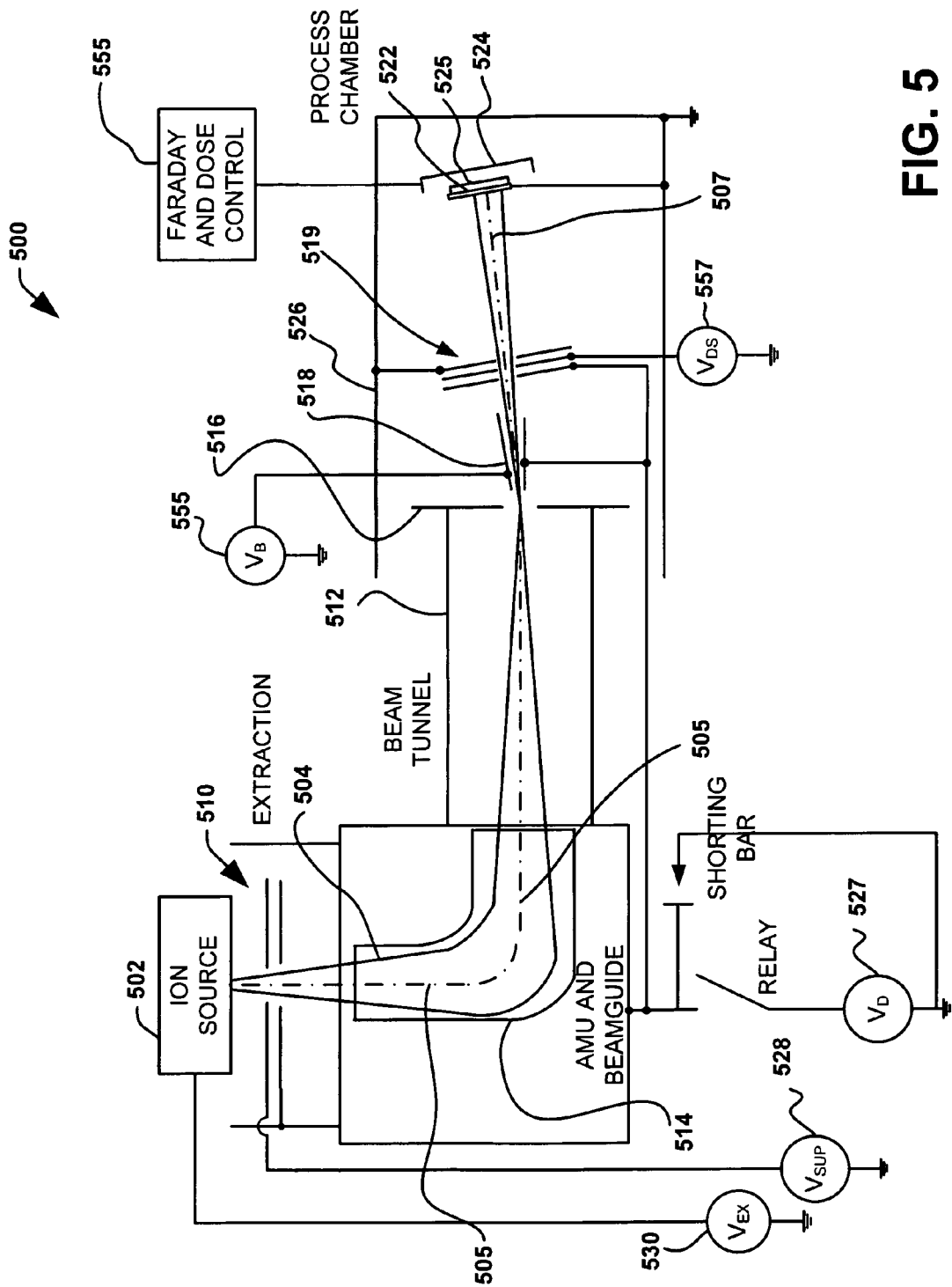
FIG. 5 is another view of an ion implantation system with its high voltage power supply system in accordance with an aspect of the present invention wherein an ion beam travels along an altered path within a rotated process chamber.

FIG. 5 illustrates an example ion implantation system 500 in accordance with an aspect of the present invention. The system 500 is presented for illustrative purposes and it is appreciated that aspects of the invention are not limited to the described ion implantation system 500 and that other suitable ion implantation systems of varied configurations can also be employed.

The ion implantation system 500 comprises an ion source 502 for producing an (e.g., a pencil ion beam, a ribbon-shaped, etc.) ion beam 504 along a longitudinal first ion beam path 505 or a second ion beam path 507. The ion beam source 502 includes a plasma source with an associated extraction power source 530 and an extraction apparatus 510, which may be of any design by which the ion beam 504 is extracted. The following examples are provided to more fully illustrate the invention, but are not to be construed as limiting the scope thereof. For instance, the plasma source may comprise a relatively long plasma confinement chamber from which the ion beam 504 can be extracted using an extraction opening in the extraction apparatus 510. The formation of pencil, ribbon and other type ion beams is well known by those of skill in the art.

To produce the ions, a gas of a dopant material to be ionized is located within the plasma source of the ion beam source 502. The dopant gas can, for example, be fed into the plasma source from a gas source (not shown). In addition to the power supply 530, it will be appreciated that any number of suitable devices (none of which are shown) can be used to excite free electrons within an ion generation chamber, such as RF or microwave excitation sources, electron beam injection sources, electromagnetic sources and/or a cathode which creates an arc discharge within the chamber, for example. The excited electrons collide with the dopant gas molecules and ions are generated thereby. Typically, positive ions are generated although the disclosure herein is applicable to systems wherein negative ions are generated as well.

The ions are controllably extracted through an extraction aperture in the extraction apparatus 510 in the ion beam source 502 by an ion extraction assembly (not shown). The ion extraction assembly can comprise a plurality of extraction, ground and suppression electrodes. It can be appreciated that since the ion beam 504 comprises like charged particles, the beam 504 may have a tendency to blow up or expand radially outwardly as the like charged particles repel one another. It is also to be appreciated that beam blow up can be exacerbated in low energy, high current (high perveance) beams where many like charged particles (e.g., high current) are moving in the same direction relatively slowly (e.g., low energy) such that there is an abundance of repulsive forces among the particles. Accordingly, the extraction assembly is generally configured so that the beam 504 is extracted at a high energy so that the beam blow up is minimized. Moreover, in decel mode, the beam 504, in this example, is generally transferred at a relatively high energy throughout the system 500 and is reduced at the deceleration element 519 which is just before impacting with the workpiece 522 to promote beam containment.

A beamline 512 is provided downstream of the ion source 502 to receive the beam 504 therefrom, comprising a mass analyzer 514 positioned along the path to receive the beam 504. The mass analyzer 514 operates to provide a magnetic field across the first ion beam path 505 so as to deflect ions from the ion beam 504 at varying trajectories according to mass (e.g., charge to mass ratio) in order to provide a mass analyzed ion beam 504 as illustrated in FIG. 5. The mass analyzer 514 performs mass analysis and angle correction/adjustment on the ion beam 504. The mass analyzer 514, in this example, is formed at about a ninety degree angle and comprises one or more magnets (not shown) that serve to establish a (dipole) magnetic field therein. As the beam 504 enters the mass analyzer 514, it is correspondingly bent by the magnetic field such that ions of an inappropriate charge-to-mass ratio are rejected. More particularly, ions having too great or too small a charge-to-mass ratio are deflected into the side walls of the mass analyzer 514. In this manner, the mass analyzer 514 merely allows those ions in the beam 504 which have the desired charge-to-mass ratio to pass therethrough and exit through a resolving aperture of the resolving aperture electrode 516.

The mass analyzer 514 can perform angle corrections on the ion beam 504 by controlling or adjusting amplitude of the magnetic dipole field. This adjustment of the magnetic field causes selected ions having the desired/selected charge-to-mass ratio to travel along a different or altered path. The resolving aperture 516 has a size and shape according to a selected mass resolution and a beam envelope of the ion beam 504.

The beamline 512 may further comprise an ion beam deflection component 518, for example, for use in low energy systems that can employ a deceleration prior to implantation into a workpiece 522. The deflection component 518 includes, for example, deflection electrodes for deflecting the ion beam 504 away from the ion beam path 505 to an altered ion beam path 507 thereby removing neutral particles from the ion beam 504 (due to their failure to deflect in the presence of a deflecting field) that may otherwise serve as energy contaminants. The deflection component 518 acts as a neutral particle separator that will separate the upstream neutral particles from the downstream ion beam 504. In addition, in essence the deflection component 518 acts like a particle block and will block a large percentage of particles traveling downstream.

One or more deceleration electrodes forming a deceleration element 519 are located downstream of the ion beam deflection component 518 in this example. The deceleration electrodes can be directly utilized for a high-current, ultra-low energy ion implanter to enable a high-current ion beam to be generated with ultra-low energy and with reduced energy contamination. Up to this point in the system 500, the beam 504 is generally transported at a relatively high energy level to mitigate the propensity for beam blow up. The deceleration electrodes comprise one or more electrodes operable to decelerate the beam 504. The electrodes typically contain apertures through which the beam 504 travels.

Nevertheless, it will be appreciated that deceleration electrodes are respectively illustrated in the exemplary system 500, as parallel and with the apertures in the same plane. These electrodes may comprise any suitable number of electrodes arranged and biased to accelerate and/or decelerate ions, as well as to focus, bend, deflect, converge, diverge, scan, parallelize and/or decontaminate the ion beam 304 such as provided in U.S. Pat. No. 6,441,382 to Huang et al., the entirety of which is hereby incorporated herein by reference.

An end station 526 is provided in the system 500, which receives the mass analyzed ion beam 504 from the beamline 512 and a target scanning system supports one or more workpieces 522 such as semiconductor wafers along the path for implantation using the final mass analyzed ion beam 504. The end station 526 includes a target scanning system 520 for translating or scanning one or more target workpieces 522 and the ion beam 504 relative to one another. The target scanning system 520 may provide for batch or serial implantation.

It will be appreciated that ion beam collisions with other particles in the system 500 can degrade beam integrity. Accordingly, one or more pumps (not shown) may be included to evacuate, at least, the beamline system 512 and mass analyzer 514.

Respective suppression and extraction power supplies 528, 530 are operatively coupled to the suppression electrode and the ion source 502. The end station 526 then receives the ion beam 504 which is directed toward a workpiece 522. It is appreciated that different types of end stations may be employed in the implanter 500. For example, a "batch" type end station can simultaneously support multiple workpieces 522 on a rotating support structure, wherein the workpieces 522 are rotated through the path of the ion beam until all the workpieces 522 are completely implanted. A "serial" type end station, on the other hand, supports a single workpiece 522 along the beamline axis 514 for implantation, wherein multiple workpieces 522 are implanted one at a time in serial fashion, with each workpiece 522 being completely implanted before implantation of the next workpiece 522 begins. In hybrid systems the workpiece 522 may be mechanically translated in a first (Y or slow scan) direction while the beam is scanned in a second (X or fast scan) direction to transfer the beam 504 over the entire workpiece 522.

For decel mode, the decel power supply 527 connects the beam guide 514, one of the bending plate of the electrical bend 518, the front decel electrode, and the rear ground electrode of the extraction system. For drift mode, the decel power supply 528 is bypassed by a grounding line. The bending power supply 555 connects to the other plate of the electrical bend 518. The decel suppression power 557 supply connects to the middle electrode of the decel elements. These power supplies adjust to give expected ion beam performance, the right bending angle, the final ion beam energy, and the optimized focusing.

A profiler, in this example, may comprise a current density sensor, such as a Faraday cup 524, for example, that measures the current density of the ion beam 504, where current density is a function of the angle of implantation (e.g., the relative orientation between the beam and the mechanical surface of the workpiece and/or the relative orientation between the beam and the crystalline lattice structure of the workpiece 522). The current density sensor moves in a generally orthogonal fashion relative to the scanned beam 504 and thus typically traverses the width of the ribbon beam 504. The dosimetry system, in one example, measures both beam density distribution and angular distribution. The wafer is moved utilizing a wafer motion control 525.

A control system 532 is present that can control, communicate with and/or adjust the ion source 502, the mass analyzer 514, the aperture assembly, the electrical bend, the decel elements, and a dosimetry system. The control system 532 may comprise a computer, microprocessor, etc., and may be operable to take measurement values of beam characteristics and adjust parameters accordingly. The control system 532 can be coupled to the terminal from which the beam 502 of ions is generated, as well as the mass analyzer 514 of the beamline system 512, and the deceleration element 519. Accordingly, any of these elements can be adjusted by the control system 532 or any number of controllers to facilitate desired ions. For example, the energy level of the beam 504 can be adapted to adjust junction depths by adjusting the bias applied to electrodes in the ion extraction apparatus 510 and the deceleration element 519, for example.

Figure 6:
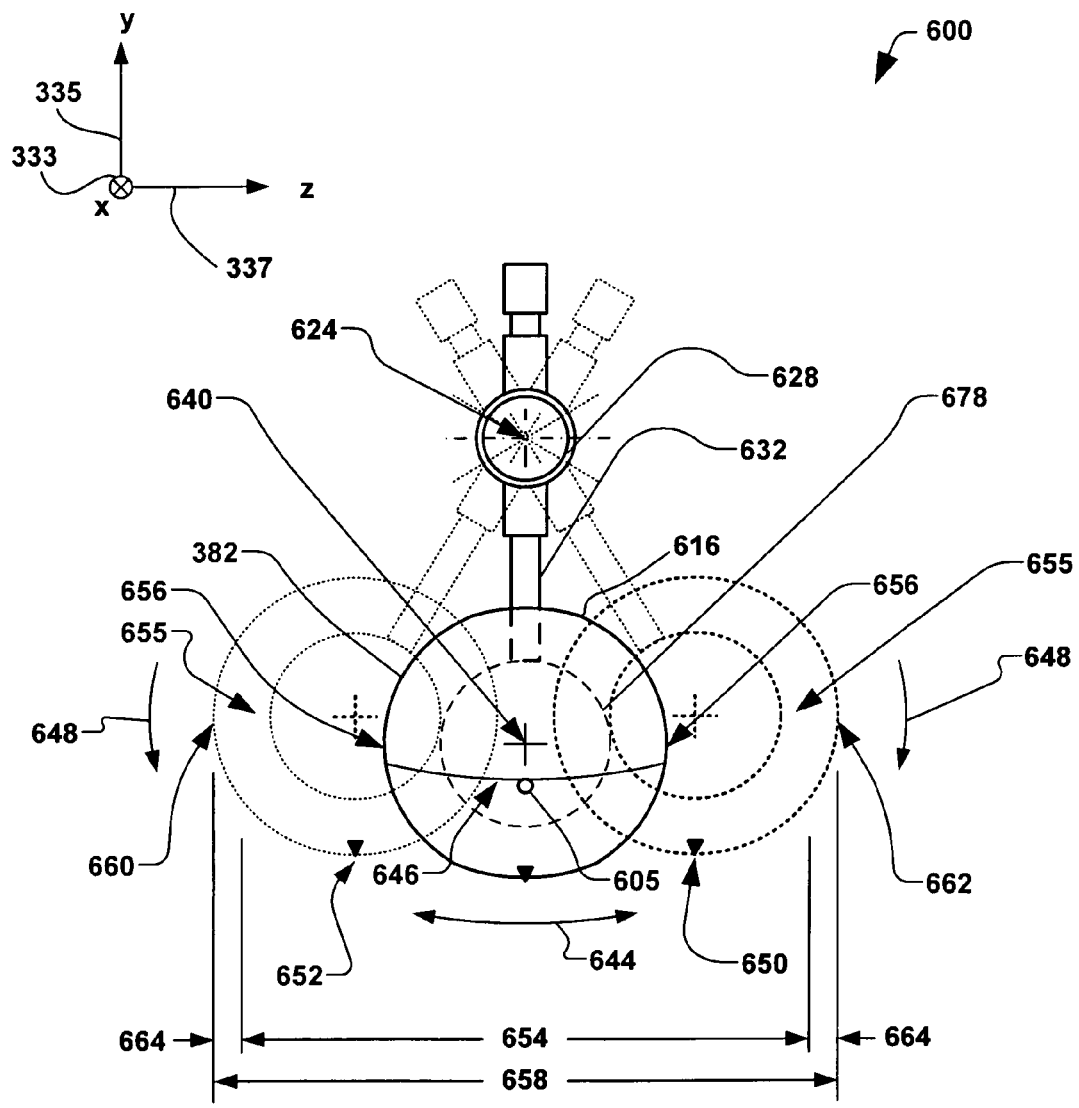
FIG. 6 is yet another schematic view of an reciprocating device ion implantation system in accordance with yet another aspect of the present invention.
Figure 7:
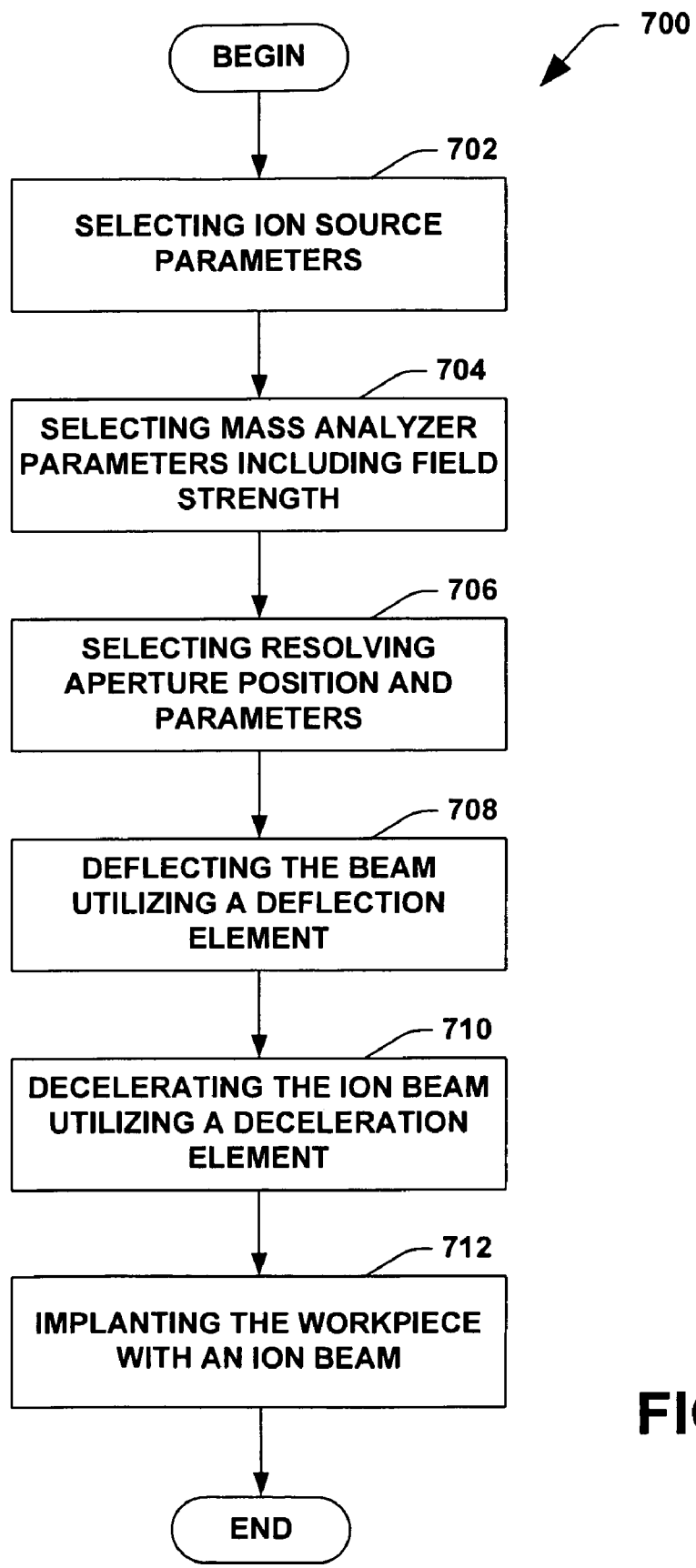
FIG. 7 is a flow diagram of a method of adjusting the angle of implantation in accordance with an aspect of the present invention.

Referring now to FIG. 6, illustrated is an exemplary ion implantation system 600 shown as a side view according to one aspect of the present invention. It will be understood that the exemplary reciprocating drive system 600 of FIG. 6 is operable to scan a workpiece 616 through an ion beam 605 in two dimensions, as will be discussed in greater detail hereafter. According to one exemplary aspect of the present invention, the reciprocating drive system 600 comprises a motor (not shown), wherein the motor of is operably coupled to a process chamber (also referred to as an end station), and wherein the process chamber is further associated with the ion beam 605. The ion beam 605, for example, may comprise a group of ions traveling together along close, substantially parallel, trajectories taking the form of a spot or so-called "pencil beam", as may be formed by any suitable ion implantation system (not shown) known in the art, the details of which will not be discussed here.

According to the present invention, the process chamber may comprise a generally enclosed vacuum chamber, wherein an internal environment within the process chamber is operable to be generally isolated from an external environment outside the process chamber. For example, the vacuum chamber can be configured and equipped so as to maintain the internal environment at a substantially low pressure (e.g., a vacuum). The process chamber may be further coupled to one or more load lock chambers (not shown), wherein the workpiece 616 may be transported between the internal environment of the process chamber and the external environment without substantial loss of vacuum within the process chamber. The process chamber may alternatively be comprised of a generally non-enclosed process space (not shown), wherein the process space is generally associated with the external environment.

In one embodiment, the process chamber can be rotated with respect to the external environment. This embodiment is referred to as the second mode (FIG. 4), for example. The present invention contemplates any process chamber 502 and process medium operable to be utilized in processing the workpiece 616, whether the process chamber is enclosed, non-enclosed, fixed, or transitory, and all such process chambers and process mediums are contemplated as falling within the scope of the present invention. An example of one type of process chamber is described in U.S. Pat. No. 7,135,691 to Vanderpot et al., the contents of which are herein incorporated by reference.

FIG. 6 illustrates is an exemplary pendulum reciprocating drive apparatus 600, wherein an exemplary rotation 644 of a shaft 628 about a first axis 624, wherein a scan arm 632, an end effector 678, and a workpiece 616 are further rotated about the first axis 624. Accordingly, the workpiece 616 can be reciprocally translated along a first scan path 646 with respect to an ion beam 605 (e.g., via one or more cyclical counter-rotations of the shaft 628 about the first axis 624), wherein the ion beam 605 is illustrated as going into the page of FIG. 6. The rotation 444 (and/or counter-rotation) of the shaft 428 about the first axis 624 can be advantageously controlled in order to oscillate or reciprocate an end effector 678 along the first scan path 646 in a uniform manner, as will be discussed hereafter. FIG. 6 further illustrates a rotation 648 of the end effector 678 about a second axis 640 as discussed above, wherein the rotation of the end effector 678, and hence, the workpiece 616, about the second axis 640 can be further controlled in order to maintain a rotational orientation 650 of the workpiece 616 with respect to the first axis 624 or ion beam 605 (e.g., rotational orientation of the workpiece 616 with respect to the ion beam 605 extraction electrode is indicated by a triangle 650 that is fixed with respect to the workpiece 616).

In order to evenly process the workpiece 616, such as providing an even implantation of ions into the workpiece 616 from the ion beam 605, it is important to maintain a generally constant translational velocity of the end effector 678 while traveling along the first scan path 646. Maintaining an approximately constant velocity of the end effector 678 while the workpiece 616 passes through the ion beam 605, for example, provides a generally uniform dose of ions to the workpiece 616. Thus even processing of the workpiece 616 is accomplished as it travels along the first scan path 646 in a pendulum-type motion.

Therefore, in another embodiment of the invention, a generally constant velocity is desired for a predetermined scanning range 654 associated with the movement of the workpiece 616 through the ion beam 605. The predetermined scanning range 654 is generally associated with the physical dimensions of the workpiece 616 (e.g., the scanning range is greater than the diameter of the workpiece 616). In the present example, the predetermined scanning range 654 is generally defined by the workpiece 616 traveling a distance greater than a total of the diameter of the workpiece 616 plus a width of the ion beam 605, wherein the workpiece 616 travels through the ion beam 605 along the first scan path 646, and wherein the ion beam 605 is scanned between opposite ends 656 of the workpiece 616.

According to yet another embodiment, a desired velocity profile for the workpiece 616 within the predetermined scanning range 654 may be defined, wherein the desired velocity profile generally depends on a configuration of the reciprocating drive apparatus 600. For example, depending on whether the workpiece 616 is fixed or rotatable with respect to the scan arm 632, a generally constant velocity or a variable velocity of the rotation 644 of the scan arm 632 (and thus, a generally constant or variable velocity of the workpiece 616 along the first scan path 646) may be desired. If, for example, the workpiece 616 is rotated with respect to the scan arm 632 in order to maintain the rotational orientation 650 along the first scan path 646, the rotational velocity of the scan arm 632 about the first axis 624 may be varied when the ion beam 605 nears ends 655 of the predetermined scanning range 654 (e.g., an increase in velocity by about 10% near the ends of the predetermined scan range) in order to provide a generally uniform dose of ions to the workpiece 616 along the curvilinear path. As another alternative, or in addition to varying the velocity of the scan arm 632, properties of the ion beam 605, such as the ion beam current, can be varied in order to produce a generally uniform dosage of ions to the workpiece 616.

As indicated in one of the embodiments above, it is generally desirable for the workpiece 616 to maintain a substantially constant velocity within the predetermined scanning range 654 along the first scan path 646 in order to generally evenly expose the workpiece 616 to the ion beam 605. However, due to the reciprocating, alternately reversing, motion of the workpiece 616 along the first scan path 646, acceleration and deceleration of the workpiece 616 is inevitable, such as between clockwise and counter-clockwise rotations (e.g., counter-rotations) of the shaft 628 about the first axis 624. Therefore, in order to accommodate acceleration and deceleration of the scan arm 632, the end effector 678, and the workpiece 616, a maximum scan distance 658 traveled by the opposite ends 656 of the workpiece 616 between maximum positions 660 and 662 along the first scan path 646 can be further defined. The acceleration and deceleration can occur in overshoot regions 664, either when the ion beam 605 is not in contact with the workpiece 616, or when at least a portion of the ion beam 605 is not in contact with the workpiece 616.

It is important to note that in conventional two-dimensional scanning systems, a permissible amount of acceleration and deceleration during a reversal of workpiece direction is substantially limited in order to minimize inertial forces and associated reaction forces transmitted to the remainder of the conventional scanning system. U.S. Pat. No. 7,135,691 describes a reciprocating drive for scanning a workpiece through an ion beam and is incorporated by reference herein.

It should also be noted that while an exemplary method is illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the system 100 illustrated and described herein as well as in association with other systems not illustrated.

The method 700 begins at 702 wherein parameters of an ion source are selected according to a desired ion specie, energy, current, and the like. The ion source 202 (See e.g., FIG. 2) can be an arc based or non arc based ion source 202, such as an RF or electron gun base ion source 202. The ion specie or species can be selected by selecting one or more source materials for the ion source 202. The current can be selected by modulating power values and/or electrodes, for example. An initial magnetic field strength for a mass analyzer 214 (See e.g., FIG. 2) can be selected according to a charge-to-mass ratio. An ion beam 204 (See e.g., FIG. 2) is generated at 706 that translates along a first beam path 505 (FIG. 5). The source aperture dimensions, in one embodiment, are approximately 2 mm in height and 100 mm in width and is approximately parallel in width prior to entering a mass analysis magnet 515 (FIG. 5).

The mass analyzer 214 (FIG. 2) can be configured downstream of the ion source 202 (FIG. 2) for receiving the ion beam 204 therefrom that performs mass analysis and angle correction on the ion beam 204. A resolving aperture 216 (FIG. 2), comprising at least one electrode downstream of the mass analyzer 214 (FIG. 2) and along the beam path 204 (FIG. 2) having a size and shape according to a selected mass resolution and a beam envelope.

At 708 the ion beam 204 traveling along a first path 305 (FIG. 3) is deflected by a deflection element 218 (FIG. 2) along a second path 307 (FIG. 3). At 710 a deceleration electrode downstream of the deflection element that decelerates the ion beam 204 (FIG. 2). At 712 a support platform 525 (FIG. 5) within an end station 526 for retaining and positioning a workpiece 522 which is implanted with charged ions, and wherein the end station is mounted approximately eight degrees counterclockwise so that the deflected ion beam 504 is perpendicular to the workpiece 522, thereafter the process ends.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. The term "exemplary" as used herein is intended to imply an example, as opposed to best or superior. Furthermore, to the extent that the terms "including", "includes", "having", "has", "with", or variants thereof are used in either the detailed description and the claims, such terms are intended to be inclusive in a manner similar to the term "comprising".

What is claimed is:

1. An ion implantation system comprising:
    an ion source configured to generate an ion beam along a beam path;
    a mass analyzer component downstream of the ion source configured to perform mass analysis on the ion beam;
    a resolving aperture downstream of the mass analyzer component configured to pass a portion of the ion beam traveling along a beamline axis;
    an endstation process chamber downstream of the resolving aperture, the endstation process chamber configured to rotate about the beam line axis, thereby defining an endstation workpiece axis therein;
    a deflection element downstream of the resolving aperture configured to change an angle of the ion beam exiting the deflection element, thereby deflecting the ion beam off of the beamline axis onto a deflection axis;
    a deceleration electrode downstream of the deflection element configured to decelerate the ion beam along the deflection axis; and
    a support platform configured to retain and position a workpiece for implantation of charged ions of the ion beam;
    wherein the deflection element and the deceleration electrode reside within the endstation process chamber, but do not rotate with the endstation process chamber, and
    wherein the support platform resides within the endstation process chamber and does rotate with the endstation process chamber.

2. The ion implantation system of claim 1, wherein the endstation process chamber is configured to rotate about the beamline axis so that the endstation workpiece axis aligns with the deflection axis, resulting in the ion beam being directed normal to the workpiece and facilitating a zero angle implant of the workpiece.

3. The ion implantation system of claim 1, wherein the endstation process chamber is configured to rotate about the beamline axis so that the endstation workpiece axis neither aligns with the beamline axis nor the deflection axis, wherein an angular deviation between the endstation workpiece axis and the deflection axis reflects a non-zero angle implant of the workpiece.

4. The ion implantation system of claim 1, wherein the endstation process chamber comprises:
    a rotary female portion; and
    a rotary male portion operably engaged with the rotary female portion,
    wherein a rotation of the rotary female portion causes the entire endstation process chamber to rotate with respect to the beamline axis, and
    wherein the rotary male portion is configured to rotate with respect to the rotary female portion.

5. The ion implantation system of claim 4, further comprising a controller operably coupled to the deflection element and the rotary female portion of the endstation process chamber, wherein the controller is operable to deactivate the deflection element and dictate a first orientation of the rotary female portion in a first mode, and activate the deflection element and dictate a second, different orientation of the rotary female portion in a second mode.

* * * * *